United States Patent [19]

Ohtaki et al.

[11] Patent Number: 4,721,991
[45] Date of Patent: Jan. 26, 1988

[54] REFRACTORY SILICIDE CONDUCTOR CONTAINING IRON

[75] Inventors: Reiji Ohtaki, Yokohama; Masanobu Ogino, Yokosuka; Yuuichi Mikata, Yokohama, all of Japan

[73] Assignee: Kabushiki Kaisha Toshiba, Kawasaki, Japan

[21] Appl. No.: 730,852

[22] Filed: May 6, 1985

[30] Foreign Application Priority Data

May 7, 1984 [JP] Japan .................... 59-89497

[51] Int. Cl.$^4$ .................... H01L 29/46; H01L 29/40
[52] U.S. Cl. .................... 357/67; 357/71; 420/578; 420/429
[58] Field of Search .................... 357/67, 71; 420/578, 420/429

[56] References Cited

U.S. PATENT DOCUMENTS

| | | | |
|---|---|---|---|
| 3,582,324 | 6/1971 | Kunert et al. | 420/578 |
| 3,854,940 | 12/1974 | Hoekje | 420/578 |
| 4,619,695 | 10/1986 | Oikawa et al. | 420/429 |

FOREIGN PATENT DOCUMENTS 0100454  2/1984  European Pat. Off. ............ 357/675

OTHER PUBLICATIONS

*Metals Handbook,* 9th Ed., vol. 2, 1979, American Society for Metals, Metals Park, Ohio.
54 J. Appln. Phys. (2), 937–43 (Feb. 1983), Ting et al.
IEEE Translations on Electron Devices, vol. ED-30, No. 11, 1480–1504 (Nov. 1983), Chow et al.
M. A. Nicolet et al., "Formation and Characterization of Transition-Metal Silicides," VLSI Electronics: Microstructure Science, vol. 6, 1983.
*Silicides for VLSI Application,* Title page and p. 30, Academic Press, 1983, Murarka, S. P.

*Primary Examiner*—Andrew J. James
*Assistant Examiner*—Jerome Jackson
*Attorney, Agent, or Firm*—Finnegan, Henderson, Farabow, Garrett & Dunner

[57] ABSTRACT

A semiconductor device having an electroconductive portion made of a multi-component alloy which may be represented by a formula:

$$M.Fe_x.Si_y$$

wherein $0 < x < 0.17$, $2 \leq y \leq 3$ and M is a metal or metals selected from Groups IV, V and VI elements in the Periodic Table.

8 Claims, 4 Drawing Figures

REFRACTORY SILICIDE CONDUCTOR CONTAINING IRON

BACKGROUND OF THE INVENTION

1. Field of the Invention

This invention relates to an improved electroconductive material for an electroconductive portion of a semiconductor device and, in particular, to a semiconductor device using an Si-bearing multi-component alloy for such an electroconductive portion.

2. Description of the Prior Art

As the electroconductive material of a semiconductor device, such as interconnection material and gate material, use has so far been made of aluminum, a polycrystalline silicon having a doped impurity, such as phosphorous, or a silicide of a metal element of Groups IV, V and VI in the Periodical Table, as represented by $MoSi_2$, $TiSi_2$.

The choice of such an electroconductive material for the interconnection material and gate material becomes more and more important in obtaining a high-speed unit of a high integration density. This is because the interconnection line on a semiconductor chip must be narrowed with a decrease in the size of the semiconductor device, with the result that the resistance in the electroconductive material forming the interconnection line is increased and thus the operation speed of the semiconductor device is largely affected. A high-temperature step is often employed in the process of manufacturing the semiconductor device, requiring a thermally and chemically stable electroconductive material.

An explanation will be given below in connection with the three conventional electroconductive materials as already set out above.

1. Aluminum

Aluminum is most popular as an electroconductive material and has a relatively low melting point, failing to withstand a high temperature atmosphere of above 1000° C., for example, in a thermal diffusion step and annealing step following the injection of ions. Therefore, aluminum has a drawback in that it can be used only in a step of an interconnection between the lead wire and the bonding pad and a subsequent step and steps free from any high-temperature process.

2. Polycrystalline Silicon Doped with an Impurity

A polycrystalline silicon is most popular for use as an interconnection material and, when in practical use, has its resistivity lowered with an impurity such as phosphorus doped therein, because it has initially a high resistivity as in the case of insulation.

The electroconductive material is often used adjacent to the insulation as in the cases where, for example, the gate electrode of a MOS transistor is formed adjacent to the gate insulation film. In such a case, if the impurity such as phosphorus is doped in the polycrystalline silicon, it is diffused in the adjacent insulation, lowering the breakdown voltage of the insulation.

This drawback becomes more prominent due to a requirement of lowering the resistance level of the electroconductive material resulting from the narrowing of lines on the semiconductor chip, that is, due to the introduction of the impurity of a high concentration into the polycrystalline silicon. When the polycrystalline silicon is to be used as the electroconductive material, such impurity introducing step such as a diffusion step is necessary. From this viewpoint, much is desired to improve this aspect.

3. Silicide of Metal of Groups IV, V and VI

Where a silicide of a metal element of Groups IV, V and VI is deposited directly on the insulation, the silicon is diffused by a subsequent thermal step in the insulation or an interface between the insulation and the silicide is not flattened due to their reaction, thus lowering the breakdown characteristic of the semiconductor device. In order to solve this problem, a polycrystalline silicon layer must be formed at the boundary between the silicide and the insulation.

SUMMARY OF THE INVENTION

It is accordingly an object of this invention to provide an electroconductive material, free from the above-mentioned drawbacks, which is suited to the high integration of semiconductor elements, and to a semiconductor device having an electroconductive portion made of such an electroconductive material.

According to this invention there is provided a semiconductor device having an electroconductive portion made of a multi-component alloy including at least a silicon, iron and a metal element of Groups IV, V and VI in the Periodic Table.

In another aspect of this invention a semiconductor device is provided having an electroconductive portion formed of an electroconductive material which is represented by a ternary alloy of a composition formula

where $0 < X < 0.17$ and preferably $0 < X < 0.15$ and $2 \leq y \leq 3$, and M is selected from a metal element of Groups IV, V and VI in the Periodic Table.

Such an Fe-bearing multi-component alloy has the following advantages:

(1) It is chemically and thermally stable and can fully withstand a high-temperature process of 1000° C.

(2) The electric resistance of the alloy is smaller than that of the conventional high-melting metal silicide free from Fe.

(3) The alloy, even if formed adjacent to the insulation, assures an improved breakdown characteristic of the insulation.

DETAILED DESCRIPTION OF THE PREFERRED EMBODIMENTS

The embodiment of this invention will be explained below by referring to the accompanying drawings.

Figure 1:
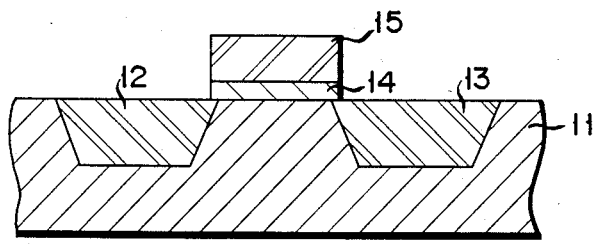
FIG. 1 is a cross-sectional view showing a MOS transistor according to one embodiment of this invention.

FIG. 1 is a view showing a MOS transistor according to one representative embodiment of this invention. The MOS transistor comprises a P-type silicon substrate 11, N-type source and drain regions 12 and 13 formed in the surface portion of the substrate 11, a gate-insulated film 14 of a silicon oxide formed on a channel region in the substrate 11 and an electroconductive portion, i.e., a gate electrode 15, formed on the gate-insulated film 14.

Figure 2:
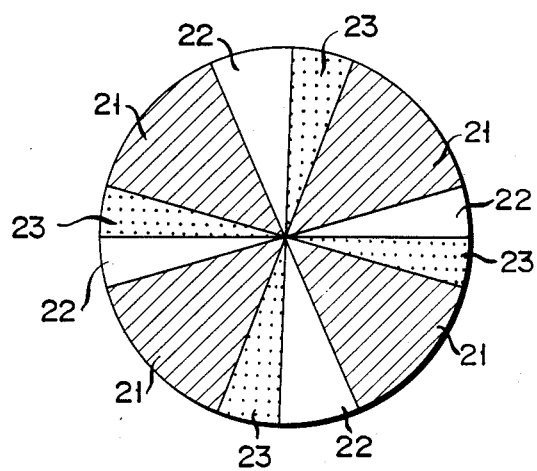
FIG. 2 is a plan view showing a sputtering target for use in forming an electroconductor portion of a semiconductor device which is made of a multi-component alloy of this invention.

The gate electrode 15 is formed of an electroconductive material, that is, a multi-component alloy made of molybdenum, silicon and iron, noting that the gate electrode is formed by a sputtering method with the use of a target as shown in FIG. 2. The target has a circular configuration of 5 cm in radius and is comprised of silicon sections 21, molybdenum sectors 22 and iron sectors 23. The sums of the respective central angles of silicon, molybdenum and iron are 240°, 84° and 36°, respectively. That is, in the alloy Mo·Fe$_x$·Si$_2$, x is set equal to 0.08. However, the ratio can be properly adjusted to correspond to the composition ratio of a desired ternary alloy. The target is not restricted to the type as set out above and can be properly formed with the above-mentioned components mixed in a predetermined ratio. The sputtering step is effected under a vacuum of, for example, $10^{-7}$ torr so as to obtain an argon ion atmosphere of $2 \times 10^{-2}$ torr at a power density of 7 W/cm$^2$.

The gate electrode 15 thus formed can adequately withstand a high temperature process at 1000° C. due to its chemical and thermal stability and can simplify the manufacturing process in comparison with the conventional manufacturing process. This process requires no impurity-introducing step as compared with the case where use is made of a polycrystalline silicon doped with an impurity as the gate electrode 15. This process also eliminates the need of forming, for example, a polycrystalline silicon layer at an interface to the gate-insulated film 14 in comparison with the case where use is made of a silicide of a metal of Groups IV, V and VI in the Periodical Table as the gate electrode 15.

Figure 3:
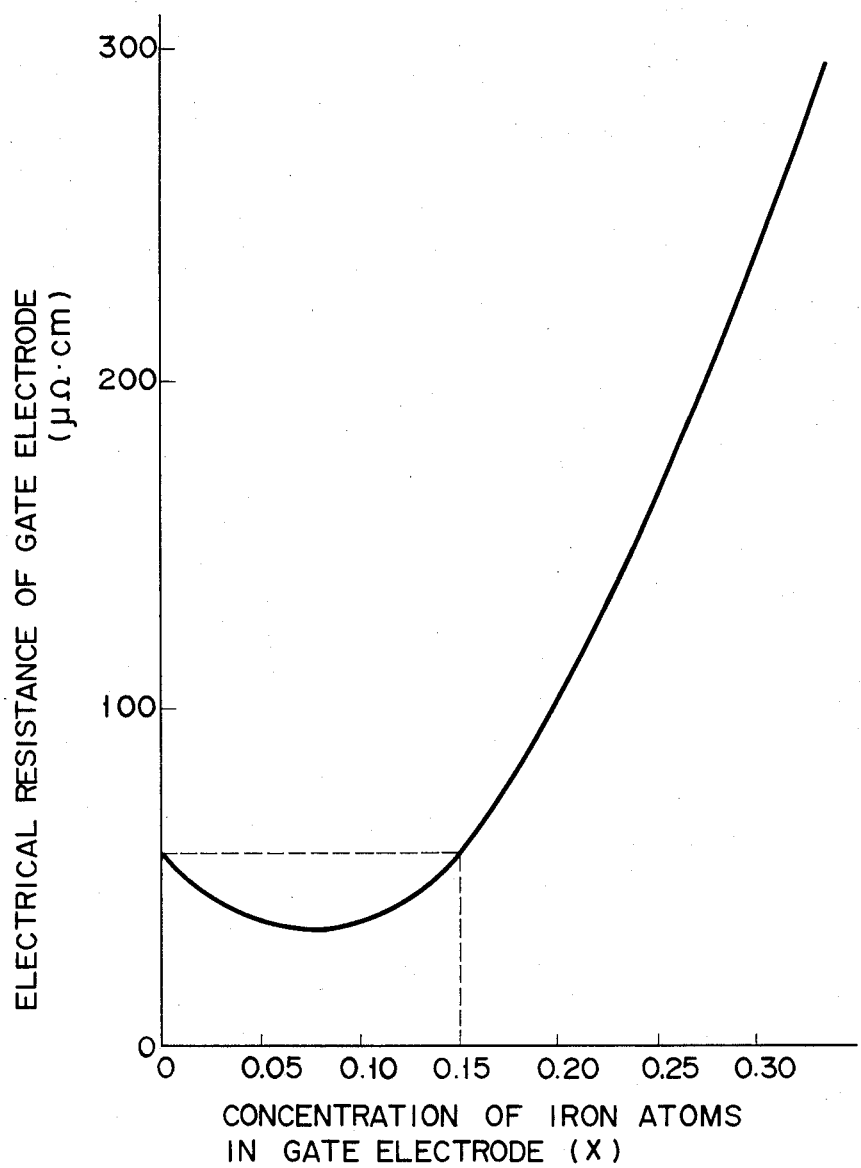
FIG. 3 is a graph showing a relation of an electrical resistance in a multi-component alloy of $Mo \cdot Fe_x \cdot Si_{2-3}$ to the concentration of iron atoms.
Figure 4:
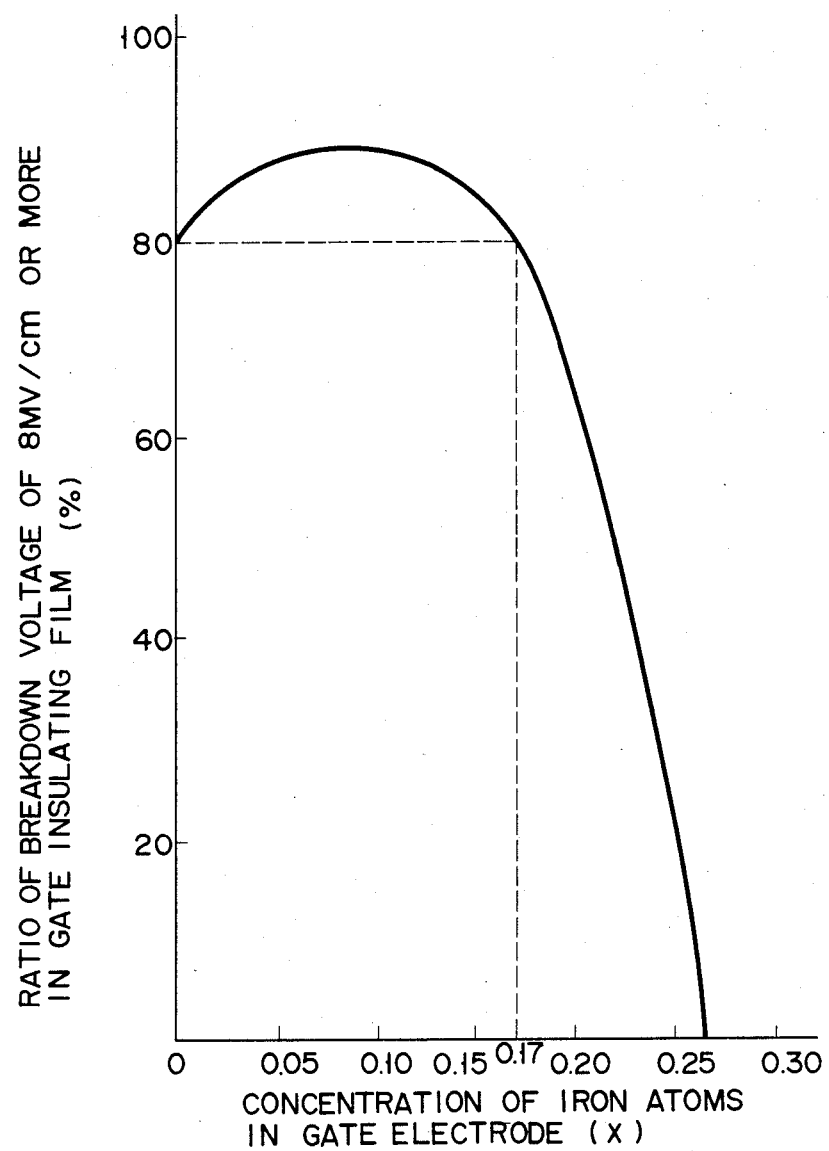
FIG. 4 is a graph showing a relation between the concentration of iron atoms and the breakdown voltage of a gate-insulated film when a multi-component alloy of $Mo \cdot Fe_x \cdot Si_{2-3}$ is formed on the gate-insulated film with a MOS transistor as a gate electrode.

The gate electrode 15 of the ternary alloy with an iron atom concentration set to about 0.08, i.e., the ternary alloy Mo·Fe$_{0.08}$·Si$_2$, reveals a smaller resistivity and improves the isolation voltage of the gate-insulated film, these facts of which will be appreciated from FIGS. 3 and 4. FIG. 3 shows a relation of the iron atom concentration to the resistivity of the gate electrode 15 and FIG. 4 shows a relation between the iron atom concentration and the isolation voltage of the gate electrode 15.

From the graph of FIG. 3 it has been found that the gate electrode 15 has a marked advantage of being smaller in resistivity at an iron atom concentration of below 0.15 than for a mere binary alloy, MoSi$_2$. From the graph of FIG. 4 it has been found that the gate-insulated film 14 has a marked advantage of being above 80% in a ratio in which the isolation voltage is above 8 MV/cm (a very desirable value for the isolation voltage), that is, a higher percentage than when the mere Mo-Si alloy is used as the gate electrode 15. This is probably due to the fact that, by a thermal step or steps subsequent to the formation of the gate electrode 15, iron atoms are diffused in the gate-insulated film 14 to permit the isolation voltage of the gate-insulated film 14 to be improved.

This invention is not restricted to the above-mentioned electroconductive portion (i.e., the gate electrode) and can also be applied to the other electroconductive portion, such as an interconnection between electrodes or a resistor. As the metal element of Groups IV, V and VI use may also be made of not only molybdenum, but also titanium, tantalum, zirconium, hafnium, vanadium, niobium or chromium. In this case, it is still possible to obtain the same advantages.

What is claimed is:

1. A semiconductor device comprising:
   (a) a silicon substrate,
   (b) an insulating layer formed on the silicon substrate, and
   (c) an interconnecting wiring layer formed on the insulating layer, the interconnecting wiring layer being formed of a multi-component alloy represented by the following compositional formula:

   M·Fe$_x$·Si$_y$ wherein $0.001 < x < 0.17$ and $2 \leq y \leq 3$ and M represents a metal element selected from Groups IV, V and VI of the periodic table.

2. A semiconductor device according to claim 1, in which M in said compositional formula M·Fe$_x$·Si$_y$ is molybdenum.

3. A semiconductor device according to claim 1, in which x in said composition formula M·Fe$_x$·Si$_y$ is greater than 0.001 and less than 0.15.

4. A semiconductor device according to claim 3, in which M in said compositional formula M·Fe$_x$·Si$_y$ is molybdenum.

5. A semiconductor device comprising:
   (a) a silicon substrate,
   (b) a source region and a drain region formed in a surface portion of the silicon substrate,
   (c) an insulating layer formed on the surface portion of the substrate defined by the source region and the drain region, and
   (d) a gate electrode formed on the insulating layer, the gate electrode being formed of a multi-component alloy represented by the following compositional formula:

   M·Fe$_x$·Si$_y$ wherein $0.001 < x < 0.17$ and $2 \leq y \leq 3$ and M represents a metal element selected from Groups IV, V and VI of the periodic table.

6. A semiconductor device according to claim 5, in which M in said composition formula M·Fe$_x$·Si$_y$ is molybdenum.

7. A semiconductor device according to claim 5, in which Fe in said composition formula M·Fe$_x$·Si$_y$ is $0.001 < x < 0.15$.

8. A semiconductor device according to claim 7, in which M in said composition formula M·Fe$_x$·Si$_y$ is Mo.

* * * * *